United States Patent
Lin et al.

(10) Patent No.: US 9,166,035 B2
(45) Date of Patent: Oct. 20, 2015

(54) DELTA DOPING LAYER IN MOSFET SOURCE/DRAIN REGION

(71) Applicant: Taiwan Semiconductor Manufacturing Company Limited, Hsinchu (TW)

(72) Inventors: Hung-Ta Lin, Hsinchu (TW); Mao-Lin Huang, Hsinchu (TW); Li-Ting Wang, Hsinchu (TW); Chien-Hsun Wang, Hsinchu (TW); Meng-Ku Chen, New Taipei (TW); Chun-Hsiung Lin, Hsinchu County (TW); Pang-Yen Tsai, Hsin-Chu Hsian (TW); Hui-Cheng Chang, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 152 days.

(21) Appl. No.: 14/025,134

(22) Filed: Sep. 12, 2013

(65) Prior Publication Data

US 2015/0069467 A1    Mar. 12, 2015

(51) Int. Cl.
*H01L 29/778* (2006.01)
*H01L 29/66* (2006.01)
*H01L 29/78* (2006.01)

(52) U.S. Cl.
CPC .......... *H01L 29/78* (2013.01); *H01L 29/66462* (2013.01); *H01L 29/7784* (2013.01); *H01L 29/7785* (2013.01)

(58) Field of Classification Search
CPC ............ H01L 29/7784; H01L 29/7785; H01L 29/66462; H01L 29/7783; H01L 29/205; H01L 29/0817; H01L 29/66318
See application file for complete search history.

(56) References Cited

U.S. PATENT DOCUMENTS

| | | | | |
|---|---|---|---|---|
| 5,504,353 A | * | 4/1996 | Kuzuhara | H01L 29/7785 257/194 |
| 6,172,384 B1 | * | 1/2001 | Morikawa | H01L 29/66462 257/280 |
| 6,271,547 B1 | * | 8/2001 | Hoke | H01L 29/7785 257/192 |
| 6,489,639 B1 | * | 12/2002 | Hoke | H01L 21/28587 257/194 |
| 2003/0141518 A1 | * | 7/2003 | Yokogawa | H01L 21/8252 257/194 |
| 2003/0218183 A1 | * | 11/2003 | Micovic | H01L 21/28575 257/192 |
| 2005/0173739 A1 | * | 8/2005 | Kusumoto | H01L 21/0485 257/263 |
| 2006/0267045 A1 | * | 11/2006 | Ogura | B82Y 10/00 257/192 |
| 2007/0052048 A1 | * | 3/2007 | Hoke | H01L 29/7785 257/431 |
| 2010/0218819 A1 | * | 9/2010 | Farmer | H01L 31/02167 136/256 |
| 2013/0320402 A1 | * | 12/2013 | Tsai | H01L 29/66318 257/194 |

* cited by examiner

*Primary Examiner* — Marvin Payen
*Assistant Examiner* — Jeremy Joy
(74) *Attorney, Agent, or Firm* — Jones Day

(57) ABSTRACT

A transistor includes a gate terminal, a source terminal and a drain terminal. At least one of the source and drain terminals has a layered configuration that includes a terminal layer and an intervening layer. The terminal layer has a top surface and a bottom surface. The intervening layer is located within the terminal layer, between and spaced from the top and bottom surfaces, is oriented to be perpendicular to current flow, and is less than one tenth the thickness of the terminal layer. The terminal layer and the intervening layer include a common semiconductive compound and a common dopant, with a concentration of the dopant in the intervening layer being over ten times an average concentration of the dopant in the terminal layer.

18 Claims, 2 Drawing Sheets

DELTA DOPING LAYER IN MOSFET SOURCE/DRAIN REGION

TECHNICAL FIELD

This relates to transistor architecture and fabrication, and more particularly to epitaxially grown terminals of transistors.

BACKGROUND

In-situ high n-type III-V doping ($>1\times10^{20}/cm^3$) growth is difficult to achieve by using metalorganic chemical vapor deposition (MOCVD). Lower n-type III-V source/drain terminals suffer higher contact resistance and lower device performance.

SUMMARY

A transistor includes a gate terminal, a source terminal and a drain terminal. At least one of the source and drain terminals has a layered configuration that includes a terminal layer and an intervening layer. The terminal layer has a top surface and a bottom surface. The intervening layer is within the terminal layer, is located between and spaced from the top and bottom surfaces, is oriented to be perpendicular to current flow, and is less than one tenth the thickness of the terminal layer. The terminal layer and the intervening layer include a common semiconductive compound and a common dopant, with a concentration of the dopant in the intervening layer being over ten times an average concentration of the dopant in the terminal layer.

DETAILED DESCRIPTION

The apparatus shown in the figures has parts that are examples of the elements recited in the claims. The apparatus includes examples of how a person of ordinary skill in the art can make and use the claimed invention. They are described here to provide enablement and best mode without imposing limitations that are not recited in the claims.

Figure 1:
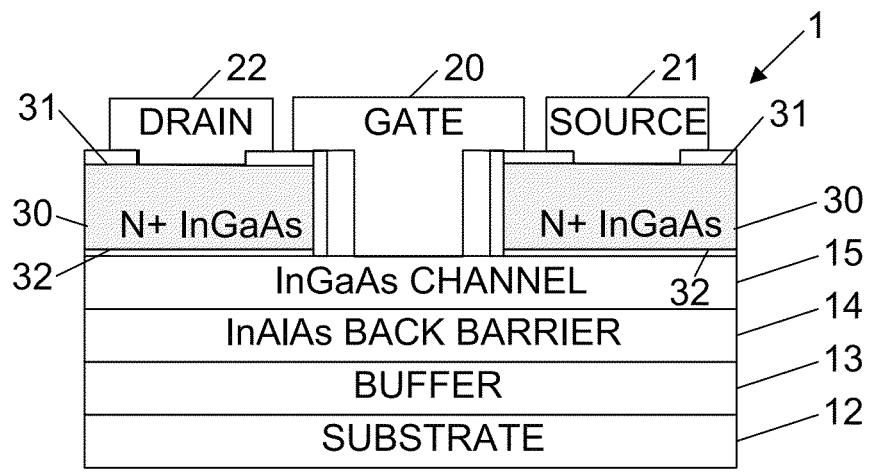
FIG. 1 is a diagram of a first MOSFET, including a source and drain that have no intervening layer.

FIG. 1 is a schematic diagram of a first example semiconductor device 1, which in this case is a first field-effect transistor (FET), and more specifically a metal-oxide-semiconductor FET (MOSFET). This first MOSFET includes successive layers—a substrate 12, a buffer 13, a back barrier 14, and a channel 15—each successive layer grown epitaxially over, and overlying, the previous layer. In this example, the buffer 13 is a semi-insulator. The back barrier 14 is a semi-insulator comprising InAlAs (indium aluminum arsenide) chemical compound. The channel 15 is of semiconductive material comprising InGaAs (indium gallium arsenide) chemical compound, doped with silicon at a dopant concentration of $2\times10^{18}/cm^3$. Three terminals—a gate 20, a source 21 and a drain 22—are grown epitaxially over the substrate.

The source and the drain terminals 21, 22 each comprise a terminal layer 30 of semiconductive material that is common to (i.e., the same for) both terminals. The semiconductive material can be a III-V chemical compound, and in this example InGaAs. The InGaAs is doped with a dopant that is common to (i.e., the same for) both terminals. In this example, the dopant is an n-type dopant (as indicated by "N+" in FIG. 1), such as silicon. The concentration of the silicon dopant is uniform throughout the terminal layer 30, at $5\times10^{19}/cm^3$. The source and drain 21, 22 each have a top surface at their top end 31 and a bottom surface at their bottom end 32. Electric current can flow from one of the ends 31, 32 to the other. The terminal layer 30 in this example has a thickness (from top surface 31 to bottom surface 32) of 45 nm.

Figure 2:
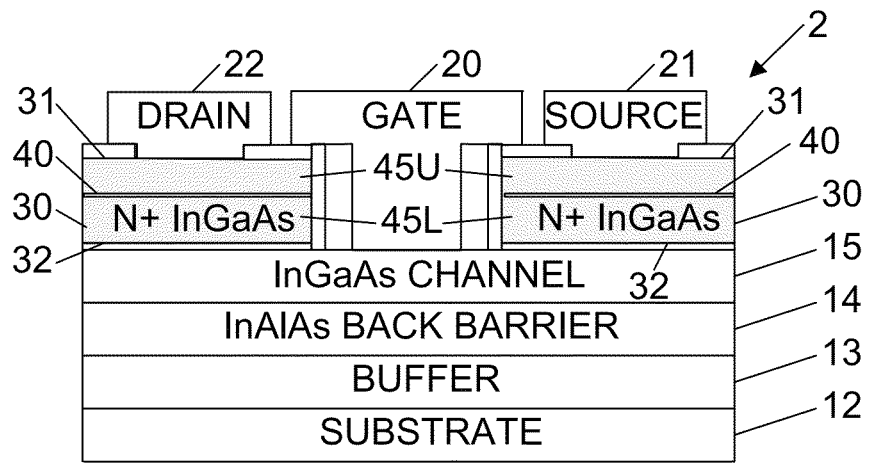
FIG. 2 is a diagram of a second MOSFET, including a source and drain that have one intervening layer.

FIG. 2 is a diagram of a second example MOSFET 2, with an architecture similar to that of the first MOSFET 1 (FIG. 1). Components in FIG. 2 are labeled with the same reference numerals as corresponding components of FIG. 1.

The second MOSFET 2 has the same source and drain terminal layers 30 as the first MOSFET 1. The second MOSFET 2 differs from the first MOSFET 1 in that each terminal layer 30 is interrupted by an intervening layer 40. The intervening layer 40 is within the terminal layer 30 and is located between and spaced apart from the terminal layer's top and bottom surfaces 31, 32. The intervening layer 40 is parallel with the top and bottom surfaces 31, 32, and is oriented to be perpendicular to current flow.

Each intervening layer 40 can be less than one tenth the thickness of the terminal layer 30 and less than six atomic layers thick. It is, in this example, a delta doping layer of one atomic layer thick.

The intervening layer 40 separates the terminal layer 30 into an upper layer section 45U and a lower layer section 45L. The intervening layer 40 overlies the lower layer section 45L and underlies the upper layer section 45U. The intervening layer 40 is grown epitaxially over the lower layer 45L, and the upper layer section 45U is grown epitaxially over the intervening layer 40.

The intervening layer 40 comprises the same semiconductive compound—InGaAs—as the terminal layer 30, and is doped with the same dopant—silicon—as the terminal layer 30. However, the intervening layer 40 has a silicon dopant concentration that is higher than, and can be over ten times the level of, the average silicon dopant concentration of either of the terminal layer 30, the upper layer section 45U and the lower layer section 45L. In this example, the dopant concentration of the intervening layer 40 is $1\times10^{13}/cm^2$.

In this example, the intervening layer 40 is 30 nm from the bottom surface 32 and 15 nm from the top surface 31, such that the lower layer section 45L is twice the thickness of the upper layer section 45U.

The dopant concentration in the thin intervening layer 40 is more than ten times the dopant concentration of the much thicker terminal layer 30. This provides a reduction in contact resistance relative to the first MOSFET 1 (FIG. 1), which has the same terminal layer dopant concentration but no intervening layer. To achieve the same reduction in contact reduction as achieved by the intervening layer 40 in the second MOSFET 2, the dopant concentration of the first MOSFET's terminal layer 30 would have to be increased by an incremental amount. That incremental increase in the bulk concentration of the first MOSFET's terminal layer 30 would be lower than the localized concentration increase in the intervening layer 40, but would be more difficult to achieve in the fabricating process than introducing the thin intervening layer 40.

Figure 3:
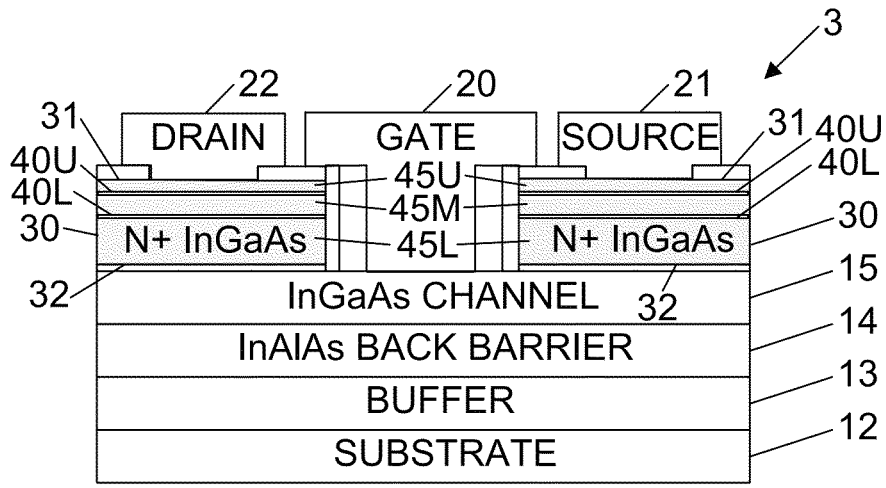
FIG. 3 is a diagram of a third MOSFET, including a source and drain that have two intervening layers.

FIG. 3 is a diagram of a third example MOSFET 3, with an architecture similar to that of the second MOSFET (FIG. 2). Components in FIG. 3 are labeled with the same reference numerals as corresponding components of FIG. 2.

The third MOSFET 3 differs from the second MOSFET 2 in that its terminal layers 30 are interrupted by a plurality of intervening layers (instead of by a single intervening layer), in this case upper and lower intervening layers 40L, 40U. Each of these intervening layers 40L, 40U is within the terminal layer 30 so as to interrupt the terminal layer 30, is parallel with the terminal layer's top and bottom surfaces 31, 32, and is oriented to be perpendicular to current flow.

The intervening layers 40L, 40U separate the terminal layer 30 into multiple sections—in this case an upper layer section 45U, a lower layer section 45L and a middle layer section 45M. Each successive layer component—the lower terminal layer section 45L, the lower intervening layer 40L, the middle terminal layer section 45M, the upper intervening layer 40U, and the upper terminal layer section 45U—is grown epitaxially over the previous layer component and overlies the previous layer component.

Each intervening layer 40L, 40U comprises the same semiconductive compound—InGaAs—as the terminal layer 30, and is doped with the same dopant—silicon—as the terminal layer 30. However, each intervening layer 40L, 40U has a silicon dopant concentration that is higher than, and can be over ten times the level of, the average silicon dopant concentration of either of the terminal layer 30, the upper layer section 45U and the lower layer section 45L. In this example, intervening layers 40L, 40U share the same dopant concentration, which in this case is $1 \times 10^{13}/cm^2$.

In this example, the terminal layer's lower section 45L is 30 nm thick, and the middle and upper terminal layer sections are each 7.5 nm thick. Accordingly, the upper intervening layer 40U is centered between the top surface 31 and the lower intervening layer 40L.

In other examples, there can be more than two intervening layers 40, which would split the terminal layer into more than three sections 45. The intervening layers 40 can be evenly spaced apart. The terminal layer sections 45 can be of equal thickness.

Each successively added intervening layer can have a successively higher dopant concentration than the intervening layer below it. Alternatively, each successively added intervening layer can have a successively lower dopant concentration than the intervening layer below it.

Figure 4:
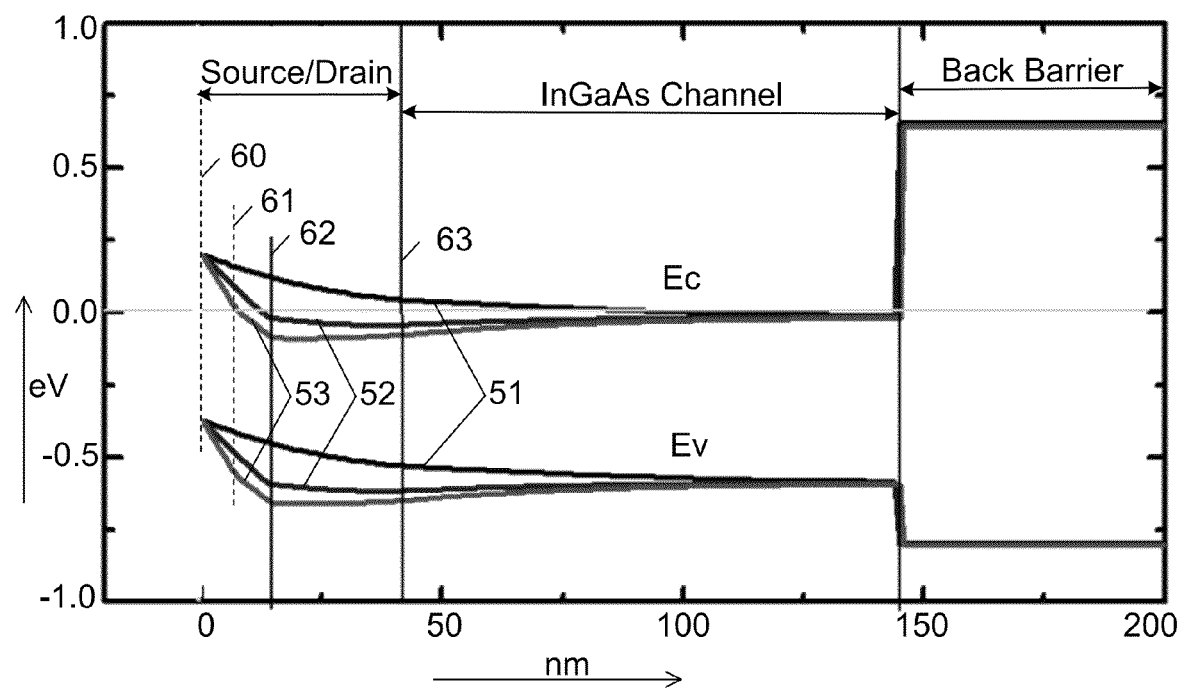
FIG. 4 is a band diagram, showing conduction and valence band edges (Ec and Ev) of the first, second and third MOSFETs.

FIG. 4 is a band diagram, graphing eV versus nm. The conduction and valence band edges (Ec and Ev) of the first, second and third example MOSFETs 1, 2, 3, are respectively labeled as curves 51, 52 and 53 in the diagram. Vertical line 60 corresponds to the source/drain terminal layer's top surface 31. Vertical line 61 corresponds to the position of the upper intervening layer 40U (FIG. 3). Vertical line 62 corresponds to the intervening layers 40 (FIG. 2) and 40L (FIG. 3). Vertical line 63 corresponds to the position of the terminal layer's bottom surface 32.

This band diagram (FIG. 4) shows that each additional intervening layer 40 successively lowers the band gap, thus reducing terminal resistance. The lowering of band gap is a positive function of the number of intervening layers 40.

The band diagram further shows that the location (in terms of nm from the top surface 31) of the lowest point of the band edges (Ec and Ev), within the source/drain and channel regions, is shifted to the left on the graph by a distance that is a positive function of the number of intervening layers. Specifically, the lowest point for the first MOSFET 1, which has no intervening layer, is at the base (bottom surface) of the channel layer 15, at about 145 nm. The lowest point of the band for the second MOSFET 2, which has one intervening layer 40, is near the bottom of the terminal layer 30 at about 40 nm. The lowest point for the third MOSFET 3, which has two intervening layers 40U, 40L, is about two thirds of the way up the terminal layer 30, at about 15 nm. Accordingly, the addition of intervening layers as described above is not only a way of lowering the band, but also a way of shifting the location of the band's lowest point toward the top surface 31. Each successively added intervening layer shifts the lowest point of the band toward the terminal layer's top surface (at 0 nm), which may successively increase current carriers and correspondingly lower electrical resistance.

The intervening-layer configuration described above for silicon doping inside the source/drain region may modulate band structure and barrier profile. This configuration may also enlarge the electron tunnel probability, with contact resistance being further reduced under optimized band structure design. This configuration may result in more cost effective in-situ doping, and less dopant chemical needed with no extra process required. This configuration may be easily integrated with a potential device performance enhancement.

In the above examples, the dopant concentration is uniform throughout the entire terminal layer 30. Accordingly, each terminal layer section 45U, 45M, 45L (FIG. 3) has a uniform dopant concentration, and the average dopant concentration is the same for all terminal layer sections.

In alternative examples, the dopant concentration can be spatially varied. For example, the dopant concentration can have a spatial gradient, increasing smoothly from the terminal layer's bottom surface 32 to the terminal layer's top surface 31 or vice versa. The dopant concentration would be smoothly graduated from one end to the other, interrupted by the sharp concentration spike(s) of the intervening layer(s) 40, 40U, 40L. The gradient (change in concentration per distance) can be uniform over the thickness of the terminal layer 30.

In another example, the dopant concentration can be uniform within each terminal layer section 45U, 45M, 45L but differ from one terminal layer section to the next. In that case, the terminal layer 30 has one uniform dopant concentration above each intervening layer 40, 40L, 40U and a different uniform dopant concentration below the respective intervening layer 40, 40L, 40U. In such examples, the average dopant concentrations of the layer sections 45 will differ from each other.

The dopant concentration of each intervening layer 40 can be over ten times the average dopant concentration of the two neighboring layer sections that adjoin the respective intervening layer 40, or over ten times the average dopant concentration of each of the layer sections 45U, 45M, 45L of the entire terminal layer 30.

In the above examples, both the source 21 and drain 22 have the same configuration. In other examples, the source and drain can have different configurations, such as differing in terms of the number of intervening layers 40 (e.g., one terminal having two intervening layer and the other terminal having one, or one terminal having at least one intervening layer 40 and the other terminal having none), thickness and spacing of the intervening layers 40, the semiconductive compound used, and/or the dopant used.

The invention claimed is:

1. A transistor comprising:
a gate terminal;
a source terminal; and a drain terminal;
wherein at least one of the source and drain terminals has a layered configuration including
a terminal layer having a top surface and a bottom surface, and
an intervening layer that is located within the terminal layer, between and spaced from the top and bottom surfaces, and that is oriented to be substantially perpendicular to current flow, and that is less than one tenth the thickness of the terminal layer; and
wherein the terminal layer and the intervening layer include a common semiconductive compound and a common dopant, with a concentration of the dopant in the intervening layer being over ten times an average concentration of the dopant in the terminal layer, and
wherein the intervening layer is spaced at least twice as far from the bottom surface as from the top surface.

2. The transistor of claim 1 wherein the semiconductive compound is a III-V compound.

3. The transistor of claim 2 wherein the III-V compound is InGaAs.

4. The transistor of claim 1 wherein the dopant is an n-type dopant.

5. The transistor of claim 4 wherein the dopant is silicon.

6. The transistor of claim 1, wherein the terminal layer has a substantially uniform dopant concentration distribution.

7. The transistor of claim 1 wherein the terminal layer has a first uniform dopant concentration above the intervening layer and a second uniform dopant concentration below the intervening layer.

8. The transistor of claim 1 wherein the terminal layer has a dopant concentration that increases smoothly from one end surface of the terminal layer to an opposite end surface of the terminal layer.

9. The transistor of claim 1, wherein the intervening layer is less than six atomic layers thick.

10. The transistor of claim 1 wherein both the source terminal and the drain terminal have the layered configuration.

11. The transistor of claim 1 wherein the source terminal and the drain terminal have substantially the same configuration.

12. The transistor of claim 1 wherein the intervening layer is a first intervening layer, and the transistor further includes at least one additional intervening layer, each additional intervening layer being within the terminal layer, being located between and spaced from the top surface and the first intervening layer, being oriented to be perpendicular to current flow, being less than one tenth the thickness of the terminal layer, and comprising the common semiconductive compound and the common dopant, with a dopant concentration of at least ten times the average dopant concentration of the terminal layer.

13. The transistor of claim 12 wherein the first intervening layer has a dopant concentration different from that of the additional intervening layer.

14. The transistor of claim 12 wherein the first intervening layer has a thickness different from that of the additional intervening layer.

15. The transistor of claim 1 wherein the terminal layer and the intervening layer are grown epitaxially.

16. The transistor of claim 1 wherein the common semiconductive compound is InGaAs, the dopant is silicon, the terminal has a uniform silicon dopant concentration of about $5 \times 10^{19}/cm^3$, and the intervening layer is one atomic layer thick with a silicon dopant concentration of about $1 \times 10^{13}/cm^2$.

17. The transistor of claim 9 wherein the intervening layer is one atomic layer thick.

18. The transistor of claim of 12, wherein the first intervening layer is located twice as far from the bottom surface as from the top surface, and the additional intervening layer is centered between the top surface and the first intervening layer.

* * * * *